United States Patent [19]

Okada

[11] Patent Number: 4,934,941
[45] Date of Patent: Jun. 19, 1990

[54] ARRANGEMENT FOR REMOVABLE CONNECTION BETWEEN SUBSTRATES

[75] Inventor: Yoshikatsu Okada, Tokyo, Japan

[73] Assignee: NEC Corporation, Tokyo, Japan

[21] Appl. No.: 293,423

[22] Filed: Jan. 4, 1989

[30] Foreign Application Priority Data

Jan. 5, 1988 [JP] Japan .................. 63-188[U]

[51] Int. Cl.⁵ ............................................. H01R 9/09
[52] U.S. Cl. ...................................... 439/60; 439/65; 439/76; 439/924
[58] Field of Search .................. 439/60, 65, 76, 78, 439/79, 630, 924

[56] References Cited

U.S. PATENT DOCUMENTS

| | | | |
|---|---|---|---|
| 3,825,874 | 7/1974 | Peverill | 339/14 R |
| 3,852,700 | 12/1974 | Haws | 339/14 R |
| 4,012,095 | 3/1977 | Doucet et al. | 339/17 C |
| 4,017,696 | 4/1977 | Falk | 439/924 |
| 4,231,629 | 11/1980 | Kirby | 339/17 M |
| 4,579,406 | 4/1986 | Laursen et al. | 439/60 |
| 4,611,873 | 9/1986 | Punako et al. | 339/94 |
| 4,612,601 | 9/1986 | Watari | 361/387 |
| 4,767,341 | 8/1988 | Lund | 439/60 |
| 4,819,131 | 4/1989 | Watari | 361/414 |

FOREIGN PATENT DOCUMENTS 224456A 6/1987 European Pat. Off. .
6068570 4/1985 Japan .

OTHER PUBLICATIONS

IBM Technical Disclosure Bulletin, vol. 21, No. 10, Mar. 1979, "Coaxial Connector" R. E. Heath et al.

Primary Examiner—P. Austin Bradley
Attorney, Agent, or Firm—Burns, Doane, Swecker & Mathis

[57] ABSTRACT

An arrangement for removable connection between substrates including a first and a second substrate and a first connector mounted on the first substrate and a second connector mounted on an edge portion of the second substrate. The second connector is adapted to be engaged with the first connector. The arrangement also includes a third connector mounted on the first substrate with the third connector having first and second contacts. A third contact is provided in the vicinity of the edge portion of the second substrate and is adapted to contact the first contact of the third connector during an initial stage of an engaging process of the first and the second connectors and to contact the second contact of the third connector after the initial stage.

18 Claims, 2 Drawing Sheets

4,934,941

ARRANGEMENT FOR REMOVABLE CONNECTION BETWEEN SUBSTRATES

BACKGROUND OF THE INVENTION

The present invention relates to an arrangement for removable connection between substrates each mounting electronic circuits thereon.

In a conventional apparatus, a package with electronic circuits mounted on a substrate is connected to a mother board mounting electronic circuits. Such a connection is made by a coupling between a connector or connectors attached to one surface of the mother board and a connector or connectors provided on an edge portion of the substrate of the package. The connector mounted on the one surface of the mother board has a plurality of signal pins and at least one power supply pin. The connector provided on the edge portion of the substrate of the package comprises signal sockets into which the signal pins of the mother board connector are inserted, and a power supply socket into which the power supply pin of the mother board connector is inserted.

There is a recent tendency for electronic apparatus such as a computer to be powered continuously for a continuous operation thereof. In order to realize such a continuous operation of the electronic apparatus, it has been usual that the power supply pin of the package connector is made longer than the signal pins, so that connection or disconnection of the signal pins to or from the signal sockets can be made after a power supply to the respective circuits of the package has been started or before the power supply is terminated. Thus, an undesirable signal which might be produced in the circuits of the package by a connection or disconnection of the power supply to or from the circuits of the package is prevented from being transmitted to the circuits on the mother board and thus an abnormal operation of the electronic apparatus can be prevented.

However, with the recent tendency of increased power consumption per package due to increased circuit density of packages of conventional electronic apparatus, a spark may be produced between the power supply pin and the power supply socket when the connectors are connected to each other or disconnected from each other. The resulting spark causes a power supply voltage variation on the circuits on the mother board.

SUMMARY OF THE INVENTION

According to an aspect of the invention, there is provided an arrangement for removable connection between substrates which comprises: a first and a second substrate; a first connector mounted on the first substrate, a second connector mounted on an edge portion of the second substrate and adapted to be engaged with the first connector, a third connector mounted on the first substrate and having a first and a second contact; and a third contact provided on the second substrate in the vicinity of the edge portion thereof and adapted to contact the first contact of the third connector during an initial stage of an engaging process between the first and the second connectors and to contact the second contact of the third connector after the initial stage.

BRIEF DESCRIPTION OF THE DRAWINGS

Other features and advantages of the invention will become apparent from the following description when taken in conjunction with accompanying drawings, in which.

In the drawings, the same reference numerals represent the same structural elements.

DETAILED DESCRIPTION OF THE PREFERRED EMBODIMENT

Figure 1:
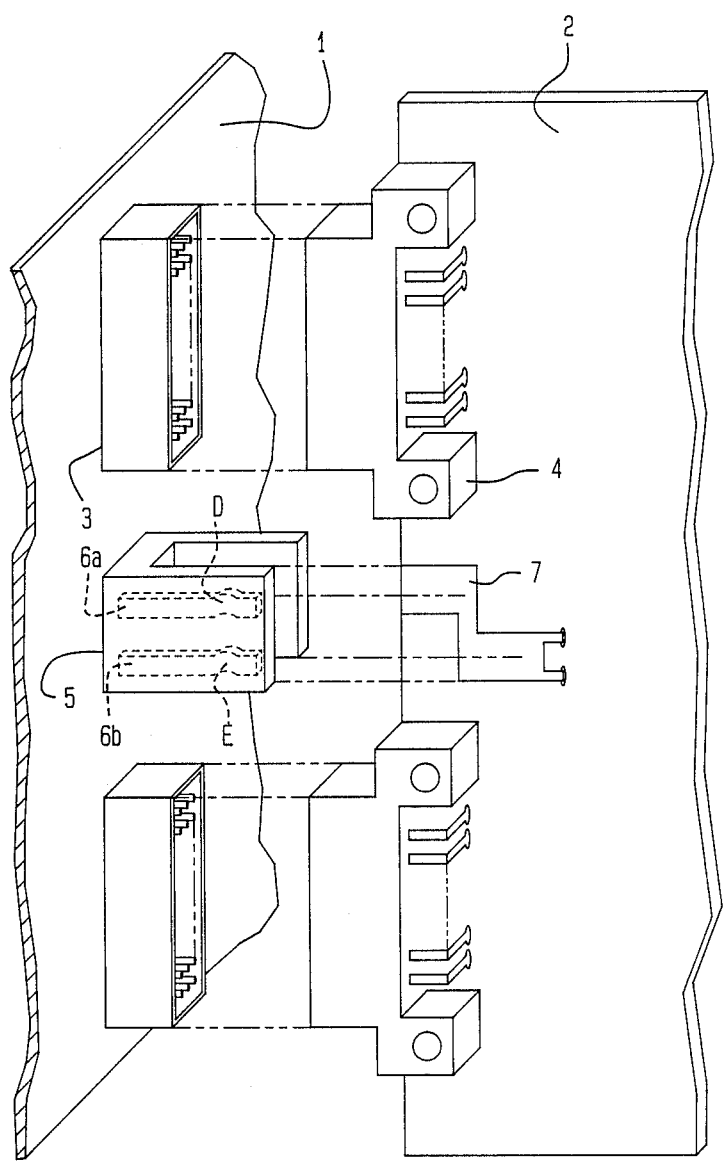
FIG. 1 is a perspective view of an embodiment of the invention.

Referring to FIG. 1, an embodiment of the invention comprises a signal plug connector 3 mounted on a mother board 1 and including a plurality of signal pins, a signal socket connector 4 mounted on a package 2 and including sockets adapted to be engaged in a one-to-one correspondence with the pins of the connector 3, a power source socket connector 5 mounted on the board 1, and a male contact 7 provided on the package 2 and adapted to be connected mechanically and electrically to the connector 5.

The connector 5 contains female contacts 6a and 6b arranged in parallel to each other. The contacts 6a and 6b are connected to an auxiliary power supply source and a main power supply source, respectively. The supply voltage of the auxiliary power supply source is set so as to be lower than that of the main power supply source.

On the other hand, the contact 7 takes a stepped pattern as shown in FIG. 1. The height of the step of the contact 7 is set as substantially equal to the distance between the contacts 6a and 6b.

Figure 2:
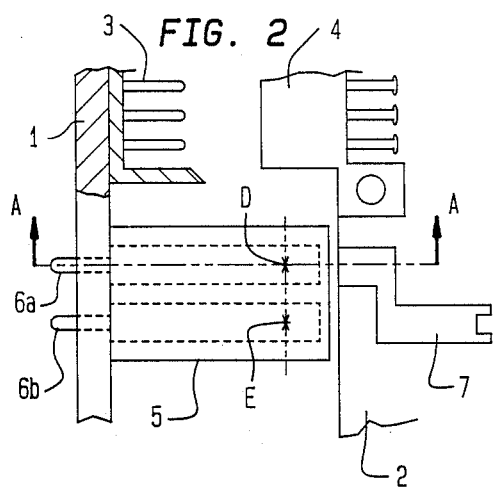
FIG. 2 shows a side view of the embodiment in which a package is completely separated from a mother board.
Figure 3:
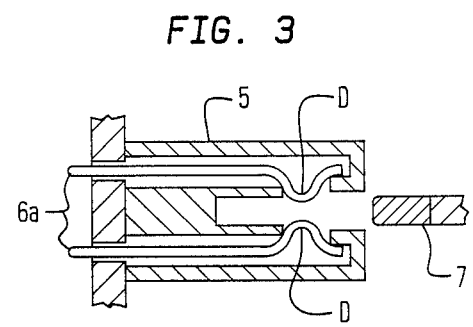
FIG. 3 shows a cross-sectional view taken along a line A—A in FIG. 2.

Description will next be made on connection and disconnection of the package 2 to and from the board 1 while circuits on the package 2 are kept active. FIG. 2 shows the package 2 and the board 1 which are not engaged with each other as yet, and FIG. 3 is a cross-sectional view taken along a line A—A in FIG. 2. The contacts 6a and 6b of the connector 5 are in electrical connection with the auxiliary power supply source and the main power supply source, respectively, as mentioned above. In FIG. 2, points depicted by D and E are contact points of the contacts 6a and 6b to which the contact 7 is to be connected.

Figure 4:
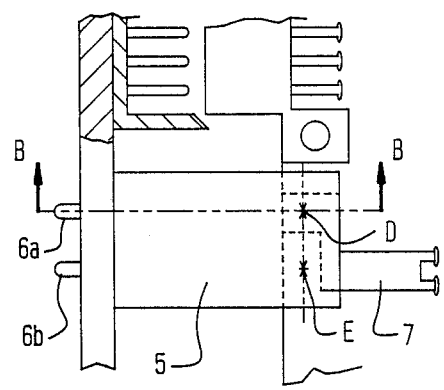
FIG. 4 is a side view of the embodiment in an initial stage of engagement of the package with the mother board.
Figure 5:
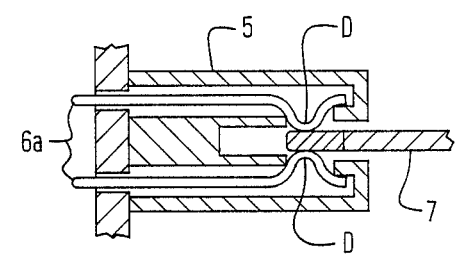
FIG. 5 is a cross-sectional view taken along a line B—B in FIG. 4.

As the package 2 is moved toward the board 1, an upper portion of the contact 7 first comes in contact with the contact 6a at the contact point D, so that the circuits on the package 2 are supplied through the contact 6a with the auxiliary supply voltage and are ready to operate, as shown in FIGS. 4 and 5. In FIG. 4, the connection between the signal pins and the sockets is not established as yet. Due to the lower supply voltage of the auxiliary power supply source, a spark hardly occurs between the contact 6a and the contact 7.

Figure 6:
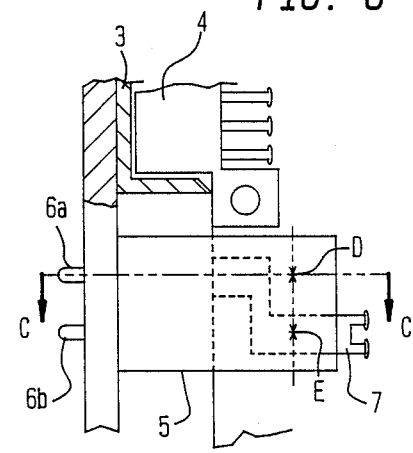
FIG. 6 shows a side view of the embodiment in which the package is completely engaged with the mother board.
Figure 7:
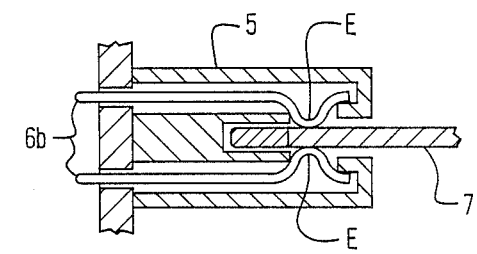
FIG. 7 shows a cross-sectional view taken along a line C—C in FIG. 6.

With a further movement of the package 2 toward the board 1, the contact of the contact 6a with the contact 7 is broken and a lower step portion of the contact 7 is brought in contact with the contact 6b electrically connected to the main power supply source, at the contact point E, as shown in FIGS. 6 and 7. In FIG. 6, the signal pins of the connector 3 are in contact with the sockets of the connector 4, so that the circuits on the package 2 are brought in a normal operation. It should be noted that, in an intermediate state between those shown in FIGS. 4 and 6, both of the contacts 6a and 6b are in contact with the contact 7. Therefore, the switching from the auxiliary power supply source to the main power supply source is performed without electrical disconnection.

In a case where the package 2 is to be disconnected from the board 1, a reverse operation to that mentioned above is performed. That is, in an initial stage of disconnection, the lower step portion of the contact 7 is separated from the contact 6b, and the signal pins of the connector 3 are separated from the sockets of the connector 4. Then, the upper step portion of the contact 7 is separated from the contact 6a without producing a spark therebetween.

While this invention has thus far been described in conjunction with the preferred embodiment thereof the invention is not limited thereto, it will now readily be possible for those skilled in the art to put this invention into practice in various other manners within the scope of the claims.

What is claimed is:

1. An arrangement for removable connection between substrates comprising: a first and a second substrate; a first connector mounted on said first substrate; a second connector mounted on an edge portion of said second substrate and adapted to be engaged with said first connector; a third connector mounted on said first substrate and having a first and a second contact; and a third contact provided in the vicinity of said edge portion of said second substrate and adapted to contact said first contact of said third connector during an initial stage of an engaging process of said first and said second connectors and to contact said second contact of said third connector after said initial stage, wherein said engaging process has an intermediate stage wherein both of said first and second contacts of said third connector are adapted to be in contact with said third contact.

2. The arrangement for removable connection between substrates as set forth in claim 1, wherein said first connector includes a plurality of signal pins and said second connector includes a plurality of sockets, each said socket adapted to engage with a corresponding one of said signal pins.

3. An arrangement as claimed in claim 1, wherein a first power supply voltage is applied to said first contact and a second power supply voltage higher than said first power supply voltage is applied to said second contact.

4. The arrangement for removable connection between substrates as set forth in claim 3, wherein said first power supply voltage is from an auxiliary power source and said second power supply voltage is from a main power source.

5. The arrangement for removable connection between substrates as set forth in claim 3, wherein said first connector includes a plurality of signal pins and said second connector includes a plurality of sockets, each said socket adapted to engage with a corresponding one of said signal pins.

6. The arrangement for removable connection between substrates as set forth in claim 1, wherein said first and second contacts of said third connector are arranged substantially in parallel.

7. The arrangement for removable connection between substrates as set forth in claim 6, wherein said third contact has a stepped configuration.

8. The arrangement for removable connection between substrates as set forth in claim 1, wherein said third contact has a stepped configuration.

9. The arrangement for removable connection between substrates as set forth in claim 8, wherein said stepped configuration of said third contact has a lower step portion and an upper step portion.

10. The arrangement for removable connection between substrates as set forth in claim 9, wherein the height of the distance between said lower step portion and said upper step portion of said third contact is substantially equal to the distance between said first and second contacts of said third connector.

11. The arrangement for removable connection between substrates as set forth in claim 10, wherein said upper step portion of said third contact is adapted to contact said first contact of said third connector and said lower step portion of said third contact is adapted to contact said second contact of said third connector.

12. The arrangement for removable connection between substrates as set forth in claim 1, wherein said first and second contacts of said third connector are arranged substantially in parallel, said third contact has a stepped configuration, said stepped configuration of said third contact having a lower step portion and an upper step portion and the height of the distance between said lower step portion and said upper step portion of said third contact is substantially equal to the distance between said first and second contacts of said third connector.

13. The arrangement for removable connection between substrates as set forth in claim 12, wherein said upper step portions of said third contact is adapted to contact said first contact of said third connector and said lower step portion of said third contact is adapted to contact said second contact of said third connector.

14. A method for removable connection between substrates comprising the steps of:
providing a first substrate and a second substrate;
mounting a first connector on said first substrate;
mounting a second connector on an edge portion of said second substrate;
mounting a third connector on said first substrate, said third connector having a first contact and a second contact;
providing a third contact in the vicinity of said edge portion of said second substrate;
contacting said third contact to said first contact of said third connector during an initial stage of an engaging process of said first connector and said second connector;
contacting said third contact to said second contact of said third connector after said initial stage of said engaging process; and
contacting both of said first and second contacts of said third connector to said third contact during an intermediate stage of said engaging process.

15. The method for removable connection between substrates as set forth in claim 14, further comprising the steps of:
   applying a first power supply voltage to said first contact of said third connector; and
   applying a second power supply voltage to said second contact of said third connector, said second power supply voltage being higher than said first power supply voltage.

16. The method for removable connection between substrates as set forth in claim 14, further comprising the steps of
   applying a first power supply voltage to said first contact of said third connector; and
   applying a second power supply voltage to said second contact of said third connector,
      said second power supply voltage being higher than said first power supply voltage, and
      wherein said first connector on said first substrate includes a plurality of signal pins and said second connector on said second substrate includes a plurality of sockets for engaging with corresponding said signal pins.

17. The method for removable connection between substrates as set forth in claim 14, further comprising the step of:
   breaking the contact between said first contact of said third connector and said third contact after said intermediate stage of said engaging process.

18. The method for removable connection between substrates as set forth in claim 17, wherein said first connector on said first substrate includes a plurality of signal pins and said second connector on said second substrate includes a plurality of sockets for engaging with corresponding said signal pins.

* * * * *